Figure 1:
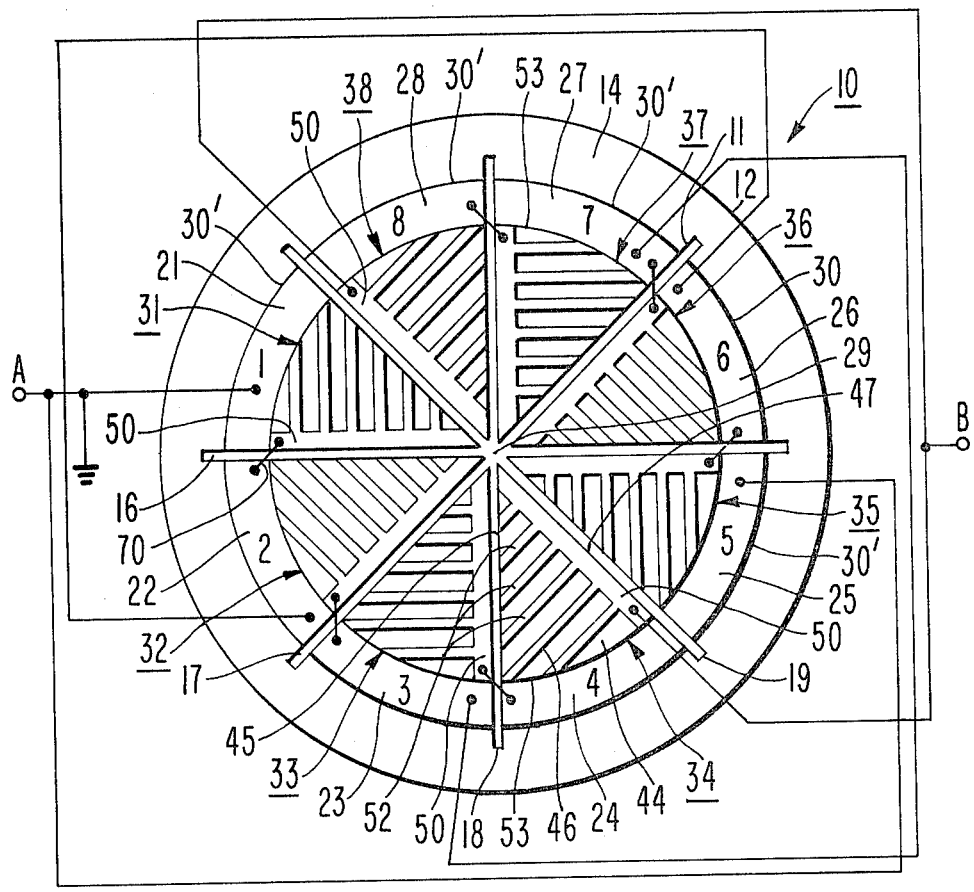

United States Patent [19]

Jebens

[11] 4,249,959
[45] Feb. 10, 1981

[54] SOLAR CELL CONSTRUCTION

[75] Inventor: Robert W. Jebens, Skillman, N.J.

[73] Assignee: RCA Corporation, New York, N.Y.

[21] Appl. No.: 98,244

[22] Filed: Nov. 28, 1979

[51] Int. Cl.³ ............................................. H01L 31/00
[52] U.S. Cl. .................................................... 136/244
[58] Field of Search ............ 136/89 P, 89 PC, 89 AC, 136/89 EP

[56] References Cited

U.S. PATENT DOCUMENTS

| 3,427,797 | 2/1969 | Kimura et al. | 58/23 |
| 3,483,038 | 12/1969 | Hui et al. | 136/89 |
| 4,038,104 | 7/1977 | Tsutomo | 136/89 P |

Primary Examiner—Aaron Weisstuch

Attorney, Agent, or Firm—Samuel Cohen; William Squire

[57] ABSTRACT

A plurality of like solar cell generators, each in the form of a segment of a circle, are spaced in a circular array on a face of a disc of insulating base material. They are formed by cutting a plurality of diagonal slits through a solar cell disc on the base material. A metallized grid structure is on the active cell face of each generator and an electrode in the form of a like circular segment juxtaposed with each generator is connected between the generator, on a side opposite the grid structure, and the base layer disc. The electrode has a terminal portion extending beyond the generator region. The slits electrically isolate the cells from each other.

13 Claims, 8 Drawing Figures

U.S. Patent Feb. 10, 1981 Sheet 3 of 3 4,249,959

SOLAR CELL CONSTRUCTION

The present invention relates to solar cell construction.

A well known form of solar cell comprises a wafer of semiconductor material which includes a base region of one conductivity type and an emitter region of opposite conductivity type. A metallized electrode grid on the surface of the emitter region is employed for receiving majority carriers generated from the semiconductor material in response to incident solar radiation. A metallized electrode overlies the entire base region.

Such solar cells may be employed in generator systems employing solar concentrators. Solar concentrators include lenses of various types which concentrate or focus solar energy into small areas of solar cells. Sun tracking devices are employed continuously to orient the solar cells and their concentrators toward the sun as the sun changes position during the diurnal cycle.

The sun tracking, however, is not perfect. The small tracking errors which occur cause the focused area of energy to be displaced from the center portion of the cell. To allow for such errors, the cell usually is made larger than the anticipated diameter of the focused area. This results in underutilization of the cell.

Further, such cells produce relatively high currents and low voltages. This is not desirable for applications which require higher voltages in that additional structure, that is, other cells must be employed to increase the voltage output. The relatively high currents produced by the cells are undesirable as they can result in excessive power losses in the cell metallization and interconnects, such losses being manifested by heating of these and other parts. In addition, the high currents require relatively large conductors.

A solar cell construction embodying the present invention comprises a layer of insulating base material and a plurality of spaced solar cell generators forming an array of generators on a face of the layer. Each generator comprises a layer of semiconductor material having a base region of one conductivity type and an emitter region of a second conductivity type, a metallized grid structure on the cell face and an electrode connected to and covering the cell base region. The electrode is secured to the insulating base material. The electrode has a terminal portion thereof extending beyond the generator base region.

In accordance with a feature of the invention, the solar cell generators are formed in spaced pairs opposite each other on a side of the base material. Conductive interconnect means are used to connect the generators of each pair in various parallel arrangements resulting in increased voltage and a lower current for a given solar cell construction.

Figure 2:
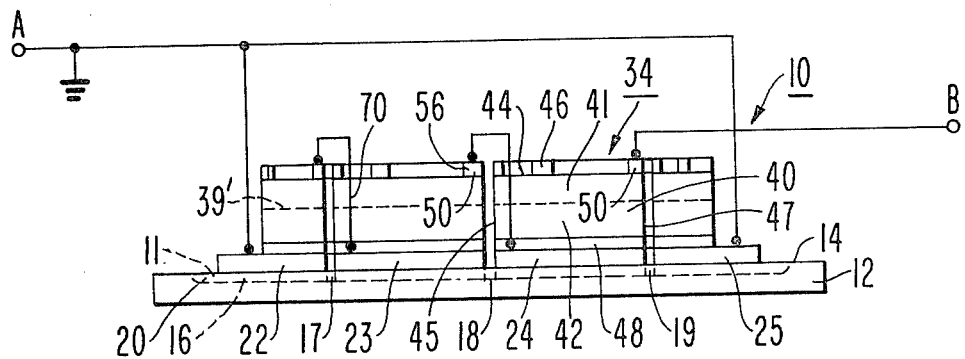
Figure 3:
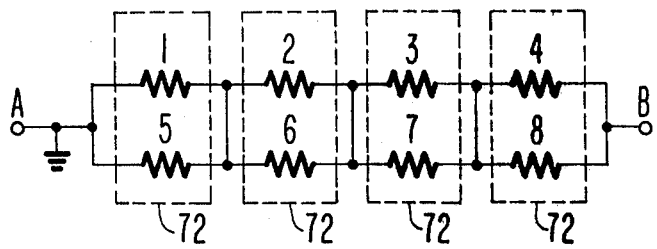
Figure 4:
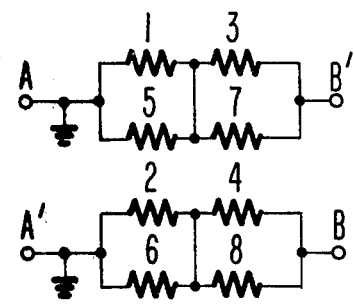
Figure 5B:
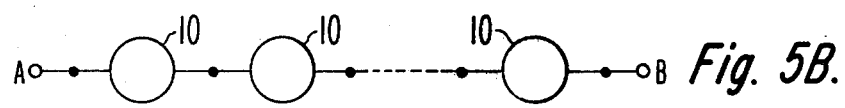
Figure 5A:
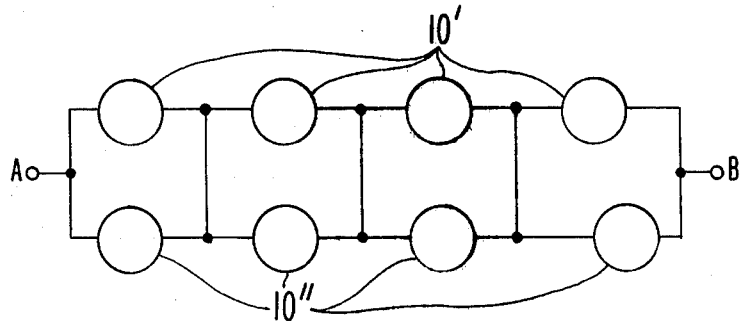
Figure 6:
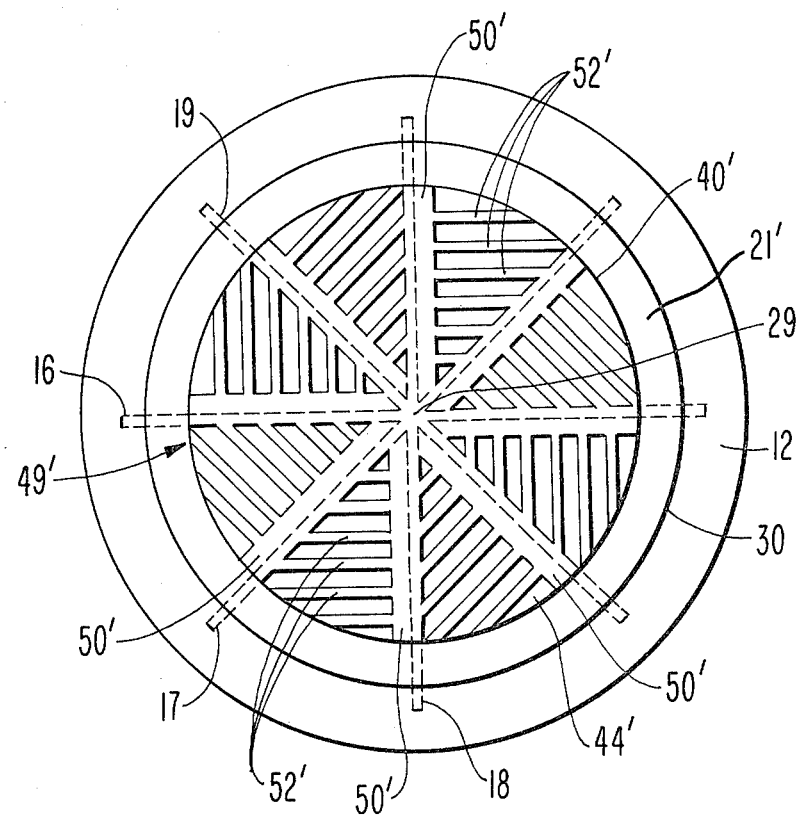
Figure 7:
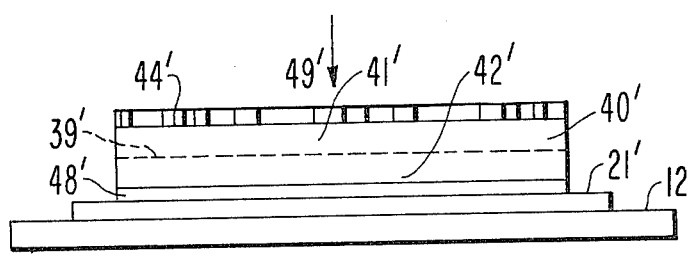

In the drawing:

FIG. 1 is a view, partially in plan and partially in schematic form of a solar cell construction embodying the present invention, FIG. 2 is a side elevation view of a solar cell construction of FIG. 1, FIGS. 3 and 4 are schematic diagrams illustrating various different interconnections of the sub-solar cells forming the cell of FIG. 1, FIGS. 5A and 5B are schematic interconnection diagrams for different arrays of cells constructed in accordance with the embodiment of FIG. 1, and FIGS. 6 and 7 are respective plan and side elevation views useful in explaining the construction of the embodiment of FIG. 1.

In FIGS. 6 and 7 a disc 12 of electrically insulating material such as beryllium oxide (BeO) has a layer such as solder 21' on one surface. The solder 21' is in the form of a thin disc of smaller diameter than and centered on disc 12. A disc of semiconductor material 40' having a base region 42' and an emitter region 41' separated at dashed line 39' has a metallized coating 48' over the entire base region 42' bottom surface. The diameter of the disc of semiconductor material 40' is smaller than that of the solder layer 21' and these two discs have a common center. A regular metallized grid pattern 49' is deposited on the emitter region 41' surface 44'. Bus elements 50' of the grid pattern 49' are interconnected with each other at central portion 29 forming a star-like pattern. Adjacent elements 50' are connected by parallel grid elements 52' which are perpendicular to one of the elements 50'. The metallized grid pattern 49' thus comprises a plurality of radially outwardly extending spokes formed by bus elements 50' interconnected by the parallel grid elements 52'. The elements 50' and 52' are identical throughout the grid pattern.

The metallized layer 48' (FIG. 7) over the base region is soldered centrally to the solder layer 21'. The resulting structure is then partially cut diagonally with a conventional diamond circular saw to form slits 16–19 shown dashed in FIG. 6 and solid in FIGS. 1 and 2. The slits 16–19 are formed along the edge of the bus elements 50'. That edge is the one to which the elements 52' are non-perpendicular. The elements 52' are thus separated from the elements 50' at the slit regions.

The slits 16–19 thus form separate generators 31–38, each in the shape of a slice of pie. The slits extend into the beryllium oxide (BeO) base material 12 (FIG. 2) at 20 to insure there is no electrical connection between adjacnet generators at the base region of layer 40'.

As best shown in FIG. 1, the slits 16–19 which can be 0.005" or less in width, extend diagonally beyond the perimeter 30 of the segmented solder layer 26' at 11 to insure that no electrical connection remains between adjacent solder layer segments 21–28. The slits which are straight, divide the disc into equally dimensioned segments subtending equal angles and forming oppositely disposed pairs generators. For example, generators 31 and 35 comprise a first pair, generators 32 and 36 comprise a second pair, and so on. This is important, as will be explained below. While it is preferable that the generators be of the same size for purposes of uniformity in electric power generation, this is not essential.

In FIGS. 1 and 2 the solar assembly 10 thus comprises circular disc 12 and a plurality of spaced, slices of pie-shaped circular solder segments on the disc forming electrodes 21–28 which are arranged in a circular array. The layers of solder forming the segments 21–28 are of a thickness depending upon the current to be carried.

A plurality of slices of pie-shaped, circular segment photovoltaic generators 31–38 formed by the slits 16–19 are on respective ones of the electrodes 21–28. The generators 31–38 are the same in construction and only one need be described. In FIG. 2 generator 34 by way of example comprises semiconductor layer 40 having an emitter region 41 and a base region 42 separated by dashed line 39'. The emitter region forms the active cell face on whose surface 44 is deposited a metallized grid structure 46. Metallized electrode layer 48 is on the surface of base region 42. The side walls 45 and 47 of the layer 40 are coextensive with the next adjacent respective slits 18 and 19. Electrode layer 48 between layer 40 and segment 24 covers the entire surface of the base region 42 and is bonded to the segment 24. In a similar manner the remaining ones of generators 31-38 are also secured to respective electrodes 21-28.

Metallized grid structure 46 on each of the acitve emitter regions of the generators 31-38 may be identical. The grid structure 46 comprises a radially extending straight bus element 50. Extending in a parallel array of comb-like fingers are the electrode grid elements 52 which are perpendicular to the bus element 50 of that generator. The width of element 50 is greater than that of elements 52. Most of the elements 52 terminate at the side wall 45 and the remaining such elements (the two outer ones in the example shown) at the perimeter edge 53. The grid structure could, in the alternative, by any one of many conventional designs. The bus element 50 terminates at one end at perimeter edge 53 and at the other edge at side wall 45. The edge of the bus element 50 between the ends is coextensive with the side wall 47 of layer 40. The apices of each of the segments comprising generators 31-38 and electrodes 21-28 are separated from and face each other in spaced relationship at the central region 29.

Following is an example of one possible interconnection of the generators 31-38. The bus element 50 of generator 31 is connected to the electrode 22 by a strap 70 which provides a series connection. Electrode 21 is connected to a source of reference potential such as ground and to a cell interconnect terminal A. Terminal A is also connected to electrode 25. Generators 31-34 are connected in series by straps similar to strap 70. Bush element 50 of generator 34 is connected to terminal B and to the bus element 50 of generators 38. Generators 35-38 are interconnected by straps in series. Electrode 22 is connected to electrode 26 and electrode 23 is connected to electrode 27.

For simplicity of explanation, generators 31-38 are designated 1-8, respectively. The interconnections of FIG. 1 are illustrated schematically in FIG. 3. The dashed lines 72 of FIG. 3 surround opposite pairs of generators in the assembly 10, FIG. 1. The resistance symbols of FIG. 3 correspond to the similarly designated generators of FIG. 1. In FIG. 3 there is a group of four serially connected parallel pairs of generators 1,5; 2,6; 3,7; and 4,8 connected between the terminals A and B. As is evident, the voltage is increased and the current reduced as compared to a single cell formerly occupying the same space. This is regardless which generator 31-38 of a pair receives the most incident sunlight as explained below.

In operation, a spot of sunlight concentrated onto the cell faces of the structure of FIG. 1 may not be exactly centered. The spot of light is always smaller than the diameter of the disc formed by the generators 31-38. As the spot of sunlight moves off center, more sunlight will be received by one or more generators than by the other generators of that generator pair. For example, generators 1 and 8 may receive more incident light than the generators 5 and 4. As a result, the generator 1 and 8 generate more current and the generators 5 and 4 generate less current. However, due to the fact that 1 and 5 are in parallel and 4 and 8 are in parallel, the average power produced by these opposite parallel pair of generators does not significantly change as the light intensity shifts from one generator to the other generator of that pair. Thus, the average power produced by the structure 10 of FIG. 1 remains substantially constant even though the position of the incident sunlight spot may vary significantly over the cell face area. Thus, the voltage output also does not change significantly for a given spot intensity as that spot shifts across the cell face.

Another arrangement is illustrated in FIG. 4. Here the generator parallel pair 1 and 5 is in series with parallel pair of generators 3 and 7. In similar fashion, the parallel pair of generators 2 and 6 is in series with the parallel pair of generators 4 and 8. Terminal B' of generator pairs 1-5 and 3-7 may be connected to terminal B of pairs 2-6 and 4-8.

The cell construction of FIG. 1 comprises one construction in an array of similar constructions as illustrated in FIGS. 5A and 5B. In FIG. 5A the interconnections of each assembly 10 generators as shown in FIGS. 3 or 4 may be utilized. Terminals A and B of the assembly 10 of each construction may be interconnected in accordance with the arrangement of FIG. 5A. Here each of assemblies 10' are in parallel with a corresponding one of assemblies 10". The parallel pairs are connected in series. In FIG. 5B terminals A and B of each assembly 10 are connected so the assemblies 10 are in series. In any case the individual interconnections on each assembly 10 in the array may be printed circuit paths (not shown) on base 12 around the periphery of layer 21' and around the slits 16-19.

While four slits are shown in FIG. 1 forming 8 generators 1-8, in practice, many more slits may be provided producing significantly more solar cells per solar cell assembly. Thus, high voltages may be produced at relatively low currents which was not heretofor possible on a small scale. For example, the assembly 10 of FIG. 1 could be made by integrated circuit techniques.

While the generators are illustrated as slices of pie-shapes, the shape of the segments need not be so limited. These structures can have peripheral edges lying along squares or rectangles. For example, the layer 40' of FIG. 7 may be made rectangular as are the solder layer 21' and the base 12. The layer 40' in this instance would have smaller perimeter sides than the layer 21' which also would have smaller perimeter sides than base 12. This assembly can then be slit by a series of parallel linear cross cuts to divide the layers 40' and 21' into an array of parallel rectangular generators on a common base. The parallel generators may be aligned in a linear array. Also a lengthwise cut normal to the cross cut may further divide the linear array into a plurality of columns of arrays in a row-column matrix. All of these generators may be interconnected with printed circuit conductors on the base layer.

What is claimed is:
1. A solar cell construction comprising:
   an insulating base layer having a perimeter of a first magnitude,
   a plurality of spaced coplanar solar cell generators, each comprising a layer of semiconductor material having a base region of a first conductivity type and an emitter region of a second conductivity type, the generators having an outer edge forming an array perimeter of a second magnitude less than said first magnitude,
   a like plurality of spaced coplanar electrode layers, each layer being secured between a separate, different one of said generator base regions and said base layer, the edges of said electrode layers lying in spaced relation, the electrode layers having an outer edge forming an array perimeter of a third magnitude less than said first magnitude and greater than said second magnitude, the electrodes extending beyond each said generator in a region between the corresponding generator and base layer perimeters forming a first cell electrode, and a metallized electrode structure on the light incident cell face of each cell forming a second cell electrode for each generator.

2. The cell construction of claim 1 wherein said generators and electrode layers are like circular segment members with the apices facing a common central area.

3. The cell construction of claim 1 wherein there are an even number of generators, said generators forming a plurality of generator pairs, the generators in each pair being opposite each other on said base layer.

4. The cell construction of claim 3 further including conductive interconnect means for connecting the generators of each pair in parallel.

5. The cell construction of claim 4 further including conductive interconnect means for connecting each said parallel pairs in series.

6. The cell construction of claim 5 further including a first plurality of said cell constructions and conductive interconnect means for connecting each said solar cell constructions in series.

7. The cell construction of claim 6 further including a second plurality of said cell constructions and conductive interconnect means for connecting the second plurality of cell constructions in series, and interconnect means for connecting a cell construction of said first and second pluralities in parallel to form serially connected parallel pairs of cell constructions.

8. The cell construction of claim 1 wherein said layers, electrodes and generators are in a circular array, said incident face metallized electrode structure includes a bus conductor extending radially outwardly from a central area edge to said generator outer edge and a plurality of conductors extending from said bus conductor.

9. The cell construction of claim 1 further including means for connecting the incident face electrode structure on each generator of a first set of generators to the electrode layer of an adjacent of a second set of generators.

10. The cell construction of claim 1 wherein said construction includes a plurality of triangular circular segment layers of generators and electrode layers whose side edges lie on lines which intersect a central area and whose outer edges form annular perimeters, said side edges of adjacent generators and electrode layers forming a channel therebetween whose bottom wall is said base layer.

11. The cell construction of claim 10 wherein said channel extends into said base layer and beyond the outer edges of said electrode layers.

12. A solar cell construction comprising:

an insulating base layer having a perimeter around an annular area of a first magnitude, a solar cell generator comprising a layer of semiconductor material having a base region of a first conductivity type and an emitter region of a second conductivity type opposite said first conductivity type, said layer of semiconductor material having a cell face perimeter around an annular area of a second magnitude smaller than said first magnitude, an electrically conductive electrode layer between said base layer and said base region, and conductively seucred to said base region, said electrode layer extending beyond said cell face area within a perimeter greater than said second magnitude and smaller than said first magnitude, forming a first generator electrode, said base layer, semiconductor material layer and electrode layer each being formed with a plurality of slits extending through said material and electrode layers partially into said base layer, said slits extending from a region between said electrode layer and base layer perimeters to and intersecting a region approximately centrally of said material, and a metallized electrode structure on the cell face of each cell formed by said slits forming a second generator electrode for that cell.

13. An array of solar cells comprising, in combination:

a group of solar cells, defined by straight slots extending radially from a common point, each pair of adjacent slots including between them, in the region between the common point and the outer ends of the slots, a solar cell, each such cell comprising:

an insulating base layer;

a conductor layer on surface of the base layer;

a semiconductor layer on the surface of the conductor layer opposite the base layer, the semiconductor layer including a base region of one conductivity type adjacent to the conductor layer and an emitter region of opposite conductivity type at the other surface of the semiconductor layer, the conductor layer extending beyond the peripheral edge of the semiconductor layer to provide an accessible terminal for the cell; and a conductive grid on said other surface of said semiconductor layer for collecting charge carriers produced by said cell; and electrical interconnections among the conductors and grids of said cells for interconnecting the cells to produce a combined electrical output, and the extensions of the conductor layer beyond the peripheral edges of the semiconductor layers together forming a circular band of terminals separated by spaced radial slots, each pair of slots defining between them an arc shaped terminal for a cell.

* * * * *